United States Patent [19]

Crevel et al.

[11] Patent Number: 5,440,151
[45] Date of Patent: Aug. 8, 1995

[54] ELECTROSTATIC DISCHARGE PROTECTION DEVICE FOR MOS INTEGRATED CIRCUITS

[75] Inventors: Philippe Crevel, Saint Jean de Boiseau; Alain Quero, Nantes, both of France

[73] Assignee: Matra MHS, France

[21] Appl. No.: 309,574

[22] Filed: Sep. 21, 1994

Related U.S. Application Data

[63] Continuation-in-part of Ser. No. 224,141, Apr. 4, 1994, abandoned.

[30] Foreign Application Priority Data

Apr. 9, 1993 [FR] France ................. 93 04263

[51] Int. Cl.⁶ ............... H01L 29/06; H01L 29/78
[52] U.S. Cl. .................. 257/173; 257/133; 257/146; 257/361; 257/362; 257/363; 257/379; 257/401
[58] Field of Search ............... 257/173, 174, 360, 361, 257/362, 363, 401, 133, 146, 379

[56] References Cited

U.S. PATENT DOCUMENTS

| | | | |
|---|---|---|---|
| 4,400,711 | 8/1983 | Avery | 297/360 |
| 4,633,283 | 12/1986 | Avery | 257/173 |
| 4,692,781 | 9/1987 | Rountree et al. | 257/360 |
| 4,694,315 | 9/1987 | Svendberg . | |
| 4,896,243 | 1/1990 | Chaterjee et al. . | |
| 4,939,616 | 7/1990 | Rountree | 257/173 |
| 5,012,317 | 4/1991 | Rountree | 257/177 |
| 5,272,371 | 12/1993 | Bishop et al. | 257/361 |
| 5,291,051 | 3/1994 | Hoang et al. | 257/361 |

FOREIGN PATENT DOCUMENTS 55-113358 9/1980 Japan ................. 257/362

OTHER PUBLICATIONS

Journal of Electrostatics—vol. 29, N° 1, Dec. 1992, Amsterdam pp. 1–19-C. Duvvury et R. Rountree "A synthesis of ESD input protection scheme".

*Primary Examiner*—Ngân V. Ngô
*Attorney, Agent, or Firm*—Larson & Taylor

[57] ABSTRACT

The protection device comprises a MOS transistor formed on the substrate of the integrated circuit and connected between a circuit pad and a reference terminal of the integrated circuit. A thyristor formed on the substrate is connected between the pad and the reference terminal. The control electrode of this thyristor consists of a region of the substrate in such a way that the thyristor can be triggerred by a current of charge carriers produced in the substrate by avalanche when a voltage rise occurs between the substrate and the drain of the MOS transistor.

29 Claims, 5 Drawing Sheets

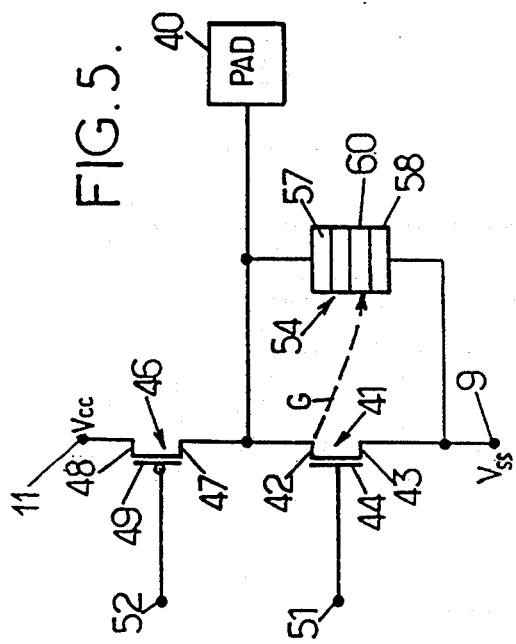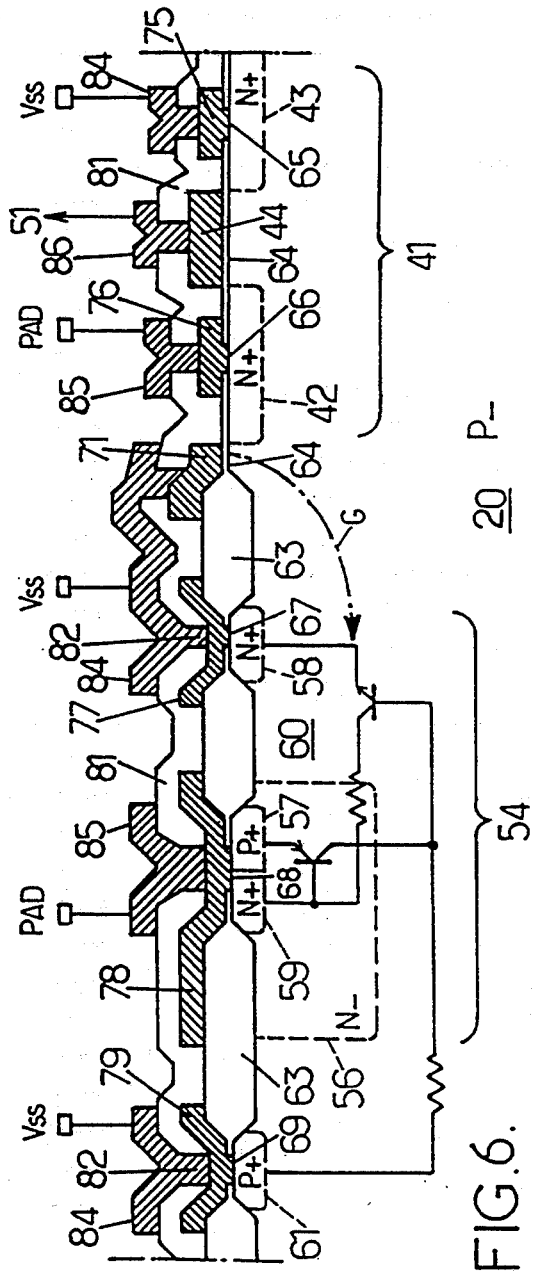

ELECTROSTATIC DISCHARGE PROTECTION DEVICE FOR MOS INTEGRATED CIRCUITS

The present application is a continuation-in-part of our application Ser. No. 08/224,141, filed on Apr. 4, 1994, now abandoned.

BACKGROUND OF THE INVENTION

The present invention relates to the protection of the inputs and/or outputs of integrated circuits against electrostatic discharges (ESD) which may appear when they are handled. The integrated circuits to be protected are MOS circuits, i.e. including a substrate made of doped semiconductor on which MOS (metal-oxide-semiconductor) transistors are formed. The invention applies especially to CMOS (complementary MOS) -type circuits.

When the circuit is handled, electrostatic charges may appear on the circuit pads and risk causing a discharge (typically a few thousand volts for a few nanoseconds) capable of irreversibly damaging the circuit.

The MOS transistor uses the effect of the electric field through a thin oxide to bring about a conversion into current of the voltage present on the gate. The growing integration of technology leads to this oxide thickness being reduced in order to obtain a better amplifying power for the transistor, to the detriment of its capacity to withstand high voltages. The inputs of CMOS integrated circuits generally consist of control gates of MOS transistors and exhibit both high impedance and great sensitivity to electrostatic discharges.

In order to satisfy the laws of integration, thinner and thinner gate oxides are produced nowadays, in which the breakdown voltages from now on are less than 20 volts for the most advanced technology.

The first protection devices used the avalanche regime of diodes mounted in reverse mode between the input pads and the Vss and Vcc power supply terminals. As long as the avalanche voltage of these diodes remains lower than the breakdown voltage of the gate oxide of the MOS transistors, the energy of the electrostatic discharge was able to be dissipated in the diodes. Unfortunately, with technical evolution, the avalanche voltages of these diodes have not fallen as much as the breakdown voltages of the gate oxides of the transistors. One solution frequently adopted is then the addition, in series between the input pad and the gate of the transistor, of a resistor which will form a time constant with the capacitance of the MOS transistor.

The use of turned-off MOS transistors in parallel with the input also constitutes an interesting alternative. During the electrostatic discharge, the voltage rises on the drain, up to the avalanche regime of the junction. In the case of a N+ diffusion for the drain, the holes thus created by avalanche diffuse into the substrate. The emission of these holes causes a potential drop in the region of the source diffusion which then behaves like the emitter of a bipolar transistor which has become conducting. This effect corresponds to the conduction regime of the MOS transistor by "snap-back". The transistor becomes conducting and removes the energy. The advantage of this solution with transistors is that the removal of the energy can be done for voltages which are lower than in the case of diodes. However, when the avalanche current becomes too high, there is a risk of destroying the protection transistor.

It is known (see U.S. Pat. No. 4,896,243 or the article "A synthesis of ESD input protection scheme" by C. Duvvury et al, which appeared in Journal of Electronics, Vol. 29, No. 1, December 1992, pp.1–19) to provide a protection thyristor in parallel with the turned-off MOS transistor. However, according to these documents, the thyristor triggers only under the effect of the voltage rise to which it is subjected. The relatively high value of the threshold voltage to be reached in order to trigger the thyristor constitutes a limitation of this known device.

ESD problems may also affect the output pads. An output pad of a CMOS circuit is normally connected to the drains of two complementary MOS transistors constituting an output buffer. An ESD event causes the voltage to rise on the drains of the buffer, up to the avalanche regime of the junctions. When the avalanche current becomes too high, the buffer transistors may be destroyed.

An object of the invention is to enhance the known protection devices in order to allow more effective removal of the electrostatic discharges, while reducing the risks of damaging the device.

SUMMARY OF THE INVENTION

According to the invention, there is provided an electrostatic discharge protection device for an integrated circuit, the integrated circuit including a substrate made of semiconductor and doped with impurities of a first type, said protection device comprising:

at least one MOS transistor having a source consisting of a diffusion of a second type of impurities formed in the substrate and connected to a reference terminal of the integrated circuit, and a drain consisting of a diffusion of the second type of impurities formed in the substrate and connected to a pad of the integrated circuit; and a thyristor having a well formed in the substrate and doped with the second type of impurities, a first electrode consisting of a diffusion of the first type of impurities formed in the well and connected to said pad, a second electrode consisting of a diffusion of the second type of impurities formed in the substrate between the well and the drain of said MOS transistor and connected to said reference terminal, and a control electrode consisting of a region of the substrate situated between the well and the second electrode of the thyristor.

When the voltage on the pad rises, the voltage across the thyristor rises at the same time as that across the MOS transistor. When this voltage becomes sufficient to create, by avalanche, electron-hole pairs within the drain junction of the MOS transistor, charge carriers migrate towards the region of the substrate which constitutes the control electrode of the thyristor. The latter then becomes conducting in order to remove the energy of the discharge. The triggering of the thyristor can be done for a relatively weak current of charge carriers, so that the risks of damage to the MOS transistor are substantially reduced. Furthermore, the removal of the energy of the discharge by a triggered thyristor is more effective than in the prior devices in which it results principally from an avalanche current.

In its application to the protection of the inputs of an integrated circuit having at least one MOS transistor formed on the substrate with a gate control input linked to an input pad, a device according to the invention may comprise:

a turned-off MOS transistor having a gate linked to a reference terminal of the integrated circuit, a first electrode consisting of a diffusion of a second type of impurities formed in the substrate and connected to said gate control input, and a second electrode consisting of a diffusion of the second type of impurities formed in the substrate and connected to the reference terminal; and a thyristor having a well formed in the substrate and doped with the second type of impurities, a first electrode consisting of a diffusion of the first type of impurities formed in the well and connected to the input pad, a second electrode consisting of a diffusion of the second type of impurities formed in the substrate between the well and the first electrode of the turned-off MOS transistor and connected to the reference terminal, and a control electrode consisting of a region of the substrate situated between the well and the second electrode of the thyristor.

In its application to the protection of the outputs of an integrated circuit, a device according to the invention forms an output buffer comprising:

at least one MOS transistor having a gate connected to a node of the integrated circuit, a source consisting of a diffusion of a second type of impurities formed in the substrate and connected to a reference terminal of the integrated circuit, and a drain consisting of a diffusion of the second type of impurities formed in the substrate and connected to an output pad of the integrated circuit; and a thyristor having a well formed in the substrate and doped with the second type of impurities, a first electrode consisting of a diffusion of the first type of impurities formed in the well and connected to said output pad, a second electrode consisting of a diffusion of the second type of impurities formed in the substrate between the well and the drain of said MOS transistor and connected to said reference terminal, and a control electrode consisting of a region of the substrate situated between the well and the second electrode of the thyristor.

Preferably, the output buffer further includes an insulating layer portion deposited on the substrate between the drain of the MOS transistor and the second electrode of the thyristor, and a conductive layer portion deposited on said insulating layer portion and connected to said reference terminal. Such disposition of a layer portion, e.g. of polycrystalline silicon, promotes migration of the charge carriers created at the drain junction during an ESD event towards the control electrode of the thyristor rather than towards the source of the MOS transistor, thereby preventing a lateral bipolar transistor from becoming conducting prior to triggering of the thyristor.

When the output buffer includes complementary MOS transistors, a thyristor may be provided in parallel with any one or both of the complementary transistors. However, it will generally be sufficient to associate a thyristor with the NMOS transistor, since NMOS transistors are usually more sensitive to ESD.

BRIEF DESCRIPTION OF THE DRAWINGS

FIG. 5 is an electrical diagram of an output buffer according to the invention.

FIG. 6 is schematic sectional view of an output buffer according to the invention.

DESCRIPTION OF PREFERRED EMBODIMENTS

Figure 1:
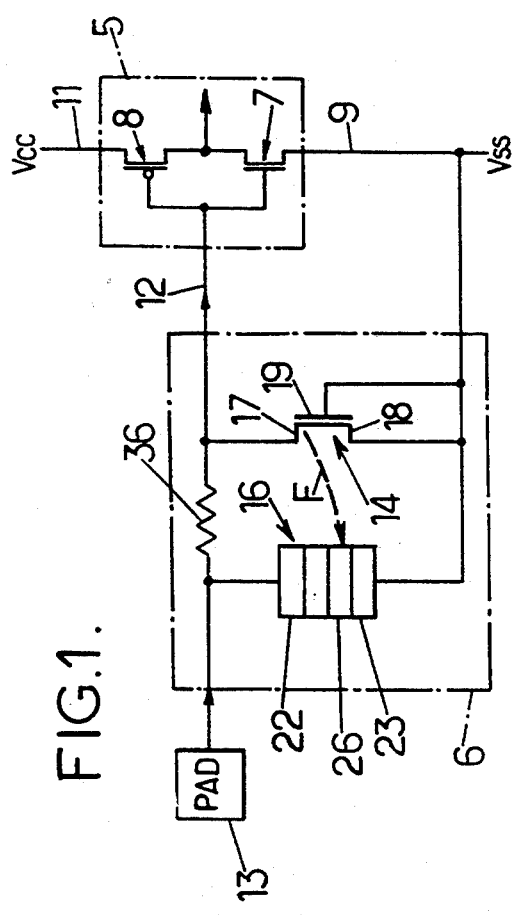
FIG. 1 is an electrical diagram of an integrated circuit incorporating an input protection device according to the invention.

In FIG. 1 an integrated circuit has been represented symbolically, produced on a common substrate (silicon) and including a CMOS circuit 5 and a protection device 6 according to a first embodiment of the invention. The CMOS circuit 5 comprises MOS transistors 7, 8 supplied with power between a reference terminal 9 at a potential Vss and a reference terminal 11 at a potential Vcc. The terminal 9 is typically an ground terminal (Vss=0 V) and the terminal 11 is a positive power supply terminal (Vcc=+5 V). The MOS transistors 7, 8 have thin gate oxides (typically 20 nm) and some of them have their gate control input 12 linked to an input pad 13 by means of the protection device 6.

The protection device comprises a MOS transistor 14 connected between the gate control input 12 and the ground terminal 9, and a thyristor 16 connected between the input pad 13 and the ground terminal 9.

Figure 2:
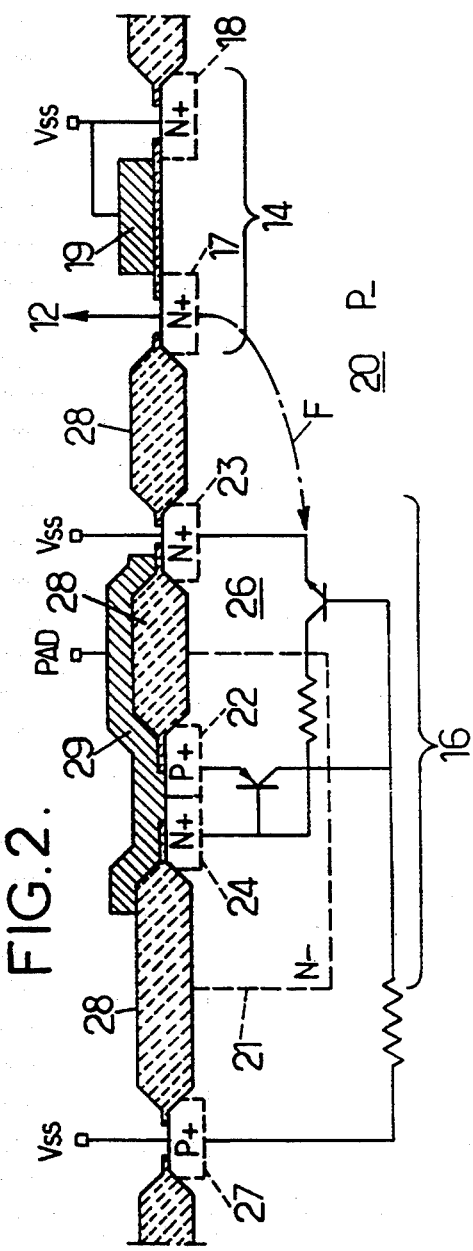
FIGS. 2 and 3 are diagrammatic views, respectively in section and seen from above, of an input protection device according to the invention.

When the substrate 20 is of P- type, i.e. doped with impurities of the electron acceptor type (for example a substrate made of silicon with $10^{15}$ atoms of boron per $cm^3$), the transistor 14 is of NMOS type (FIG. 2). Its drain 17, connected to the gate control input 12, consists of a N+ type diffusion formed in the substrate 20, and its source 18, connected to the ground terminal 9, consists of another N+type diffusion formed in the substrate 20. These two diffusions correspond to a doping of the semiconductor with impurities of the electron donor type (for example silicon with $10^{20}$ atoms of phosphorus per $cm^3$). The gate 19 of the transistor 14, made of polycrystalline silicon, is also connected to the ground terminal 9, so that the NMOS transistor 14 is turned-off.

The thyristor 16 comprises a well 21 formed in the substrate and doped N-- with impurities of electron donor type (for example silicon with $10^{16}$ atoms of phosphorus per $cm^3$), in which the anode 22 of the thyristor is formed, which consists of a P+ type diffusion (for example silicon with $10^{20}$ atoms of boron per $cm^3$). Anode 22 is connected to the input pad 13. The cathode 23 of the thyristor 16, connected to the ground terminal 9, consists of a N+ type diffusion formed in the substrate 20 between the well 21 and the drain 17 of the NMOS transistor 14. Another N+ type diffusion 24 is formed in the well 21 beside the anode 22 and connected to the pad 13 in order to bias the well of the thyristor.

The control electrode 26 of the thyristor 16 consists of the region of the substrate 20 situated between the well 21 and the cathode 23 of the thyristor.

The substrate 20 is held at the potential Vss by a connection 27 consisting of a P+ type diffusion formed in the substrate 20. The well 21 of the thyristor is situated between this diffusion 27 and the NMOS transistor 14.

In FIG. 2 the resistors and the bipolar transistors have been represented symbolically, forming the equivalent diagram of the thyristor 16. The semiconductor material of the protection device is covered by a thick oxide layer 28 leaving exposed the regions which have to be connected to other parts of the circuit. In order to connect the diffusions 22 and 24 of the thyristor to the input pad 13, a metallization 29 is used which, above the oxide 28, substantially covers the whole region situated between the anode 22 and the cathode 23 of the thyristor. This metallization 29 is in contact with the diffusions 22, 24 and connected to the input pad 13.

Figure 3:
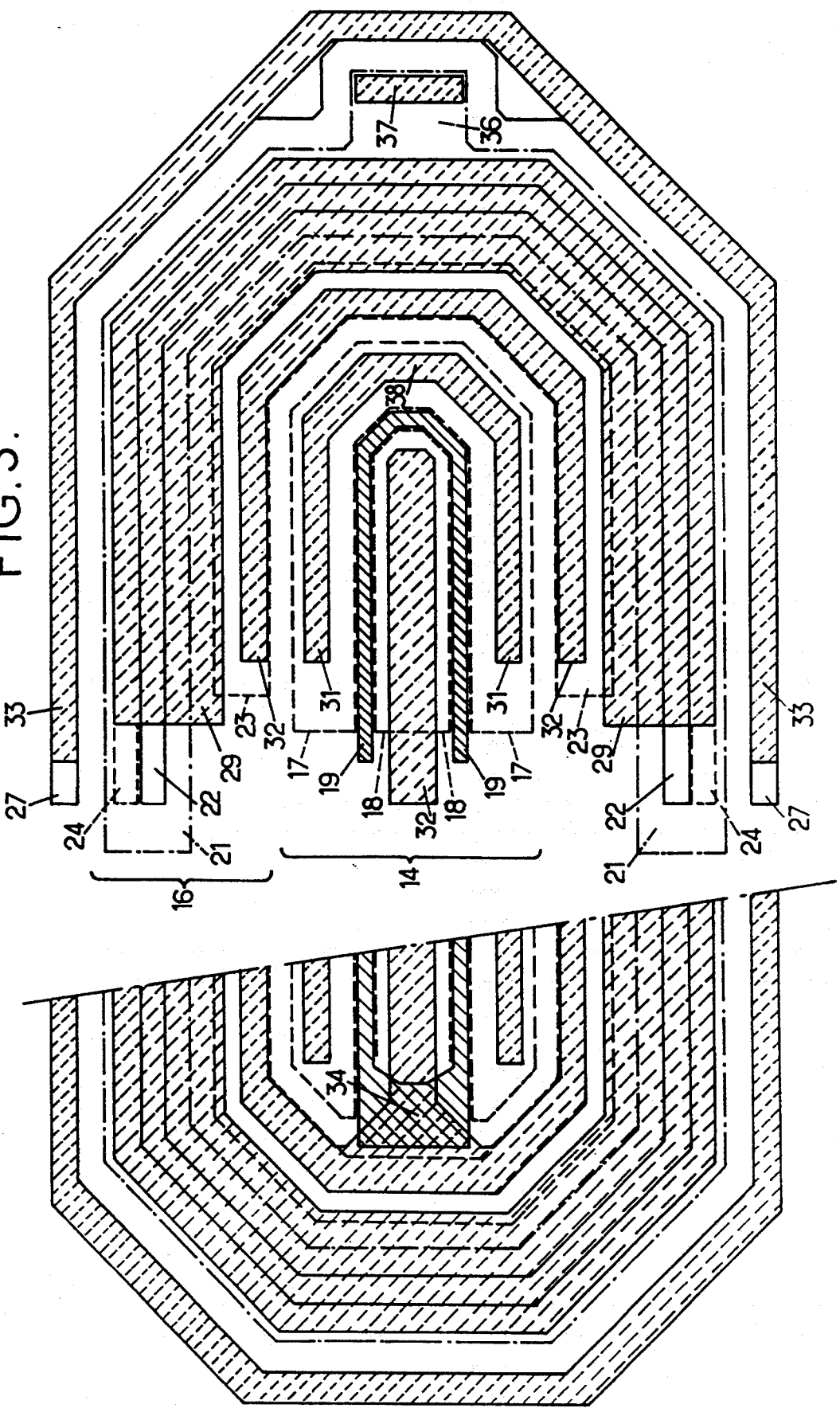

A diagrammatic top view of the protection device is represented in FIG. 3. It is seen that the device, particularly the NMOS transistor 14 and the thyristor 16, has a general ring configuration on the substrate, the central part of which is not represented in order to facilitate the reading of the drawing. The N+ type diffusions 17, 18, 23, 24 are represented by contours in dashes. The P+ type diffusions 22, 27 are represented by contours in solid lines. The N− type well 21 is represented by a contour in dots and dashes. The polycrystalline silicon gate 19 of the NMOS transistor is represented by a hatched area. Finally the metallization 29, as well as the metallizations 31, 32 and 33 forming contacts respectively for the diffusions 17 (drain of the transistor 14), 18 (source of the transistor 14) and 27 (connection for the substrate 20), are represented by regions with broken hatching. The NMOS transistor 14 occupies the central part of the ring configuration. The diffusion 17 forming the drain of this transistor and its metallization 31 are interrupted on one side of the ring to allow a common connection to the ground terminal 9 of the gate 19 and source 18 of the transistor 14, and of the cathode 23 of the thyristor 16, in a region marked with the number 34.

On the opposite side of the ring, the well 21 is extended by a protrusion 36 which extends out to a contact area 37. In a way which is not represented, this contact area 37 is connected to the gate control input 12 and to another contact area 38 forming part of the metallization 31 relating to the drain of the NMOS transistor 14. The protrusion 36 of the well 21 forms a resistor of the order of 1 k Ω linking the gate control input 12 to the input pad 13 which is connected directly to the N− well 21 by the N+ diffusion 24 (see FIG. 1).

When electrostatic charges appear on the input pad 13, a rise in voltage occurs between the substrate 20, at the potential Vss, and the drain 17 of the NMOS transistor 14. From a certain voltage threshold, electron-hole pairs are created by avalanche within the PN junction between the drain and the substrate. This results in a current of holes which diffuse into the substrate. Due to the resistivity of the substrate and to the fact that the connection 27 is further from the drain 17 than the region 26 forming the trigger electrode of the thyristor 16, the holes arrive in this region 26 before being removed by the connection 27 (arrow F in FIGS. 1 and 2). This local de-biasing of the substrate in the region 26 causes triggering of the thyristor 16 which becomes conducting with a very low resistivity so as to remove the energy of the discharge. The removal of the energy is particularly effective when the ring configuration represented in FIG. 3 is adopted. The fact that the metallization 29 covers the region situated between the well 21 and the cathode 23 of the thyristor further enhances the removal of the energy by the supplementary effect of the thick-oxide, field-effect transistor thus created between the N− well and the N+ cathode. The resistor 36 connected between the input pad and the gate control input serves to limit the increase in the voltage on the drain of the NMOS transistor before the firing of the thyristor.

Figure 4:
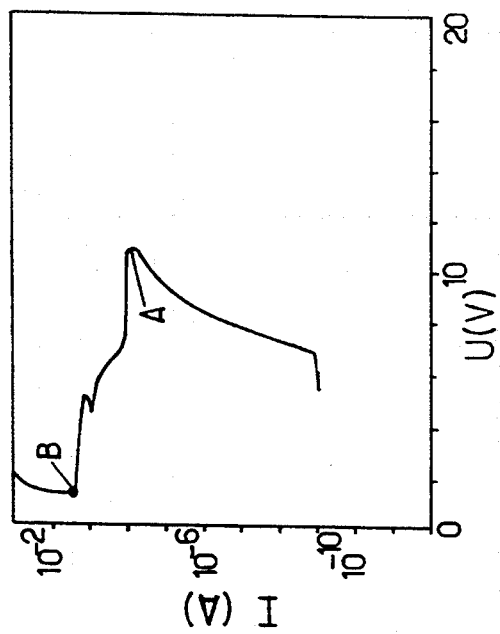
FIG. 4 is a chart showing a current-voltage characteristic of the device of FIGS. 2 and 3.

The current-voltage characteristic of a protection device according to the invention is presented in FIG. 4, in which the abscissae indicate the voltage U in volts between the input pad 13 and the ground terminal 9, and in which the ordinates indicate, in logarithmic coordinates, the current strength I in amps of a current injected into the input pad. This electrical plot was obtained by forcing a current ramp I, which makes it possible better to view the triggering of the thyristor and its hold point as indicated in FIG. 4 respectively by the points A and B. This characteristic shows that the overvoltage appearing on the input pad does not exceed 11 volts and that a current of 100 mA can be withstood by the structure without degradation. Upon an electrostatic discharge, the same protection mechanism by short circuit is implemented.

FIG. 5 illustrates an output pad 40 of the integrated circuit associated with an output buffer constituting a second embodiment of the invention. In a conventional manner, the output buffer includes a NMOS transistor 41 and a PMOS transistor 46 having respective drains 42, 47 connected together to the output pad 40. The source 43 of NMOS transistor 41 is connected to the ground terminal 9, and the source 48 of PMOS transistor 46 is connected to the positive reference terminal 11. The gate 44 of NMOS transistor 41 is connected to a node 51 of the integrated circuit, and the gate 49 of PMOS transistor 46 is connected to a node 52 of the integrated circuit, which may be the same as or different from node 51. The NMOS transistor 41 is shown in the cross-sectional view of FIG. 6. The substrate 20 of the circuit being of the P− type (e.g. silicon with $10^{15}$ atoms of boron per cm$^3$), the drain 42 and the source 43 each consist of a N+ type diffusion formed in the substrate (e.g. silicon with $10^{20}$ atoms of phosphorus per cm$^3$), and the gate 44 is made of polycrystalline silicon.

The output buffer further includes a thyristor 54 connected in parallel with NMOS transistor 41. The thyristor 54 comprises a well 56 formed in the substrate and doped N− with impurities of electron donor type (for example silicon with $10^{16}$ atoms of phosphorus per cm$^3$), in which the anode 57 of the thyristor is formed, which consists of a P+ type diffusion (for example silicon with $10^{20}$ atoms of boron per cm$^3$). Anode 57 is connected to the output pad 40. The cathode 58 of the thyristor 54, connected to the ground terminal 9, consists of a N+ type diffusion formed in the substrate 20 between the well 56 and the drain 42 of the NMOS transistor 41. Another N+ type diffusion 59 is formed in the well 56 beside the anode 57 and connected to the pad 40 in order to bias the well of the thyristor. The control electrode 60 of the thyristor 54 consists of the region of the substrate 20 situated between the well 56 and the cathode 58 of the thyristor.

The substrate 20 is held at the potential Vss in the vicinity of the output buffer by a connection 61 consisting of a P+ type diffusion formed in the substrate 20. The well 56 of the thyristor 54 is situated between this diffusion 61 and the NMOS transistor 41.

In FIG. 6 the resistors and the bipolar transistors have been represented symbolically, forming the equivalent diagram of the thyristor 54.

When manufacturing the circuit, the substrate 20 is first P− doped and the N− well 56 is formed therein. A first oxide layer is conventionally formed on the substrate, with thick oxide layer portions 63 and thin oxide layer portions 64. The thin oxide layer portions 64 correspond to the active regions of the circuit and have contact apertures 65-69 etched therein for providing electrical connections with the diffusions to be formed. Then, polycrystalline silicon is deposited to form, inter alia, the gate 44 of the NMOS transistor 41. Such polycrystalline silicon also includes a portion 71 situated above the region between drain 42 of transistor 41 and cathode 58 of thyristor 54. Then, the N+ and P+ diffusions are formed by a conventional self-aligned process. Then, a first metallization layer is deposited on the substrate. The first metallization layer includes different portions on the thin oxide layer portions: a portion 75 contacting source 43 through apertures 65; a portion 76 contacting drain 42 through apertures 66; a portion 77 contacting cathode 58 of thyristor 54 through apertures 67; a portion 78 contacting both diffusions 57 and 59 through apertures 68; and a portion 79 contacting diffusion 61 through apertures 69. A second thick oxide layer 81 is then deposited on the circuit. The second oxide layer 81 is provided with vias 82. A second metallization layer is deposited on the second oxide layer 81 and contacts the first metallization layer through the vias 82. The second metallization layer includes: a first portion 84 connected to the ground terminal 9 and in contact with portions 75, 77 and 79 of the first metallization layer and with the polycrystalline silicon portion 71 for providing the Vss connection of source 43, polysilicon 71, cathode 58 and diffusion 61; a second portion 85 connected to the output pad 40 and in contact with portions 76 and 78 of the first metallization layer for providing the pad connection of drain 42 and anode 57; and a third portion 86 connected to the circuit node 51 and in contact with the polycrystalline silicon gate 44. It has been found that the best ESD protection properties are obtained when the vias 82 formed in the second oxide layer portions are in alignment above respective contact apertures 65-69 of the underlying thin oxide layer portions.

Figure 7:
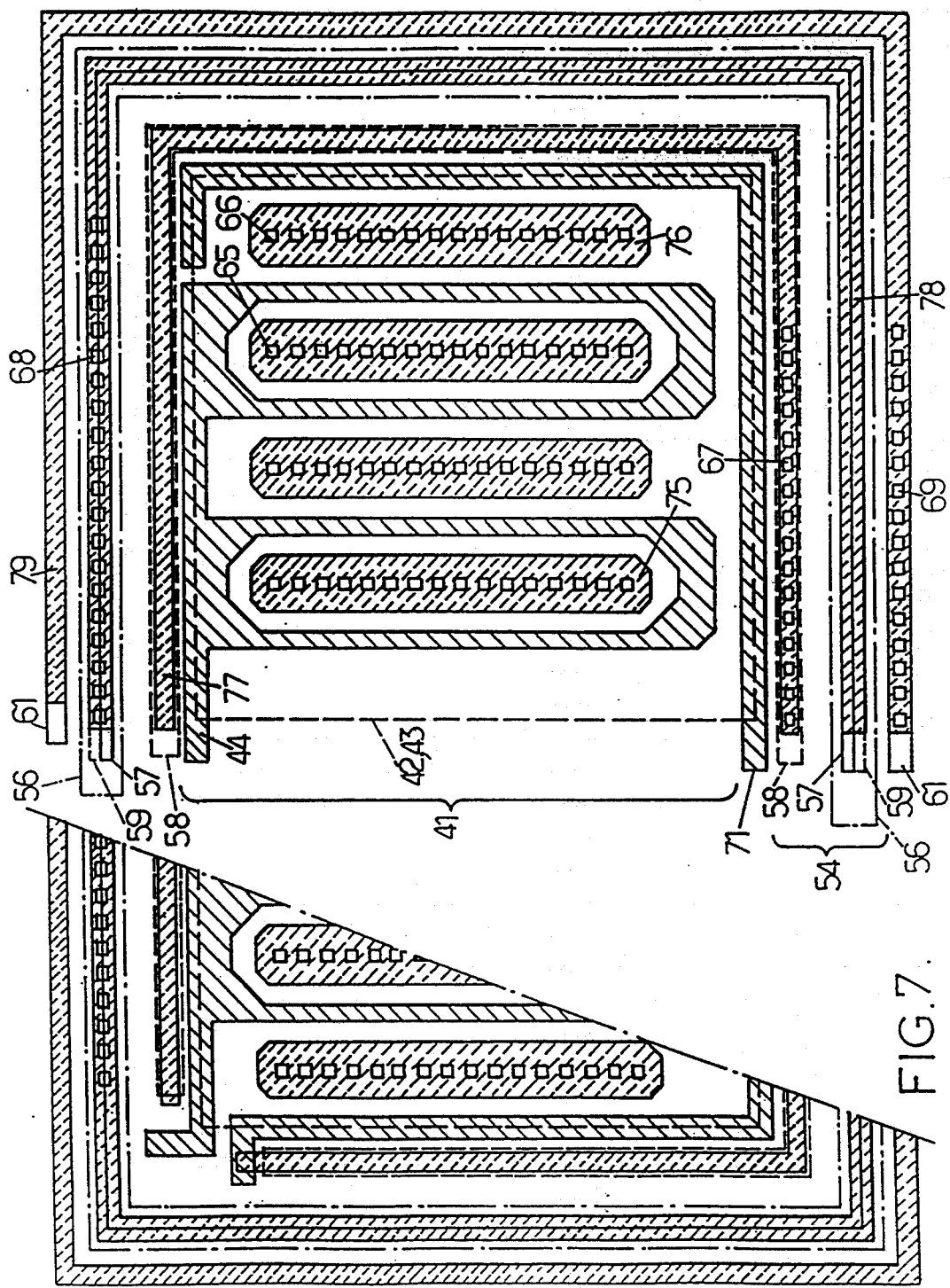
FIGS. 7 and 8 are schematic top views of portions of an output buffer according to the invention.

FIG. 7 shows a diagrammatic top view of the output buffer after formation of the first metallization layer. It is seen that the thyristor 54 has a general ring configuration on the substrate, and surrounds the NMOS transistor 41 and the polycrystalline silicon portion 71. The N+ type diffusions 42, 43, 58, 59 are represented by contours in dashes (for clarity, the shape of the implantation mask is represented rather than the actual self-aligned N+ diffusion shape). The P+ type diffusions 57, 61 are represented by contours in solid lines. The N− well 56 is represented by a contour in dots and dashes. The polycrystalline silicon 44, 71 is represented by hatched areas. Finally, portions 75-79 of the first metallization layer are represented by regions with broken hatching. The illustrated NMOS transistor 41 is composed of a plurality of ring-shaped gates in a parallel arrangement, each surrounding a source region 43, and separated from each other by drain regions 42. Thus, the outer part of the NMOS transistor consists of the drain 42, whereby drain 42 is located as close as possible to the thyristor 54. The polycrystalline silicon portion 71 interposed between the drain 42 and the thyristor 54 surrounds the MOS transistor, except in the top region of FIG. 7 where the gates are connected to the node 51.

Figure 8:
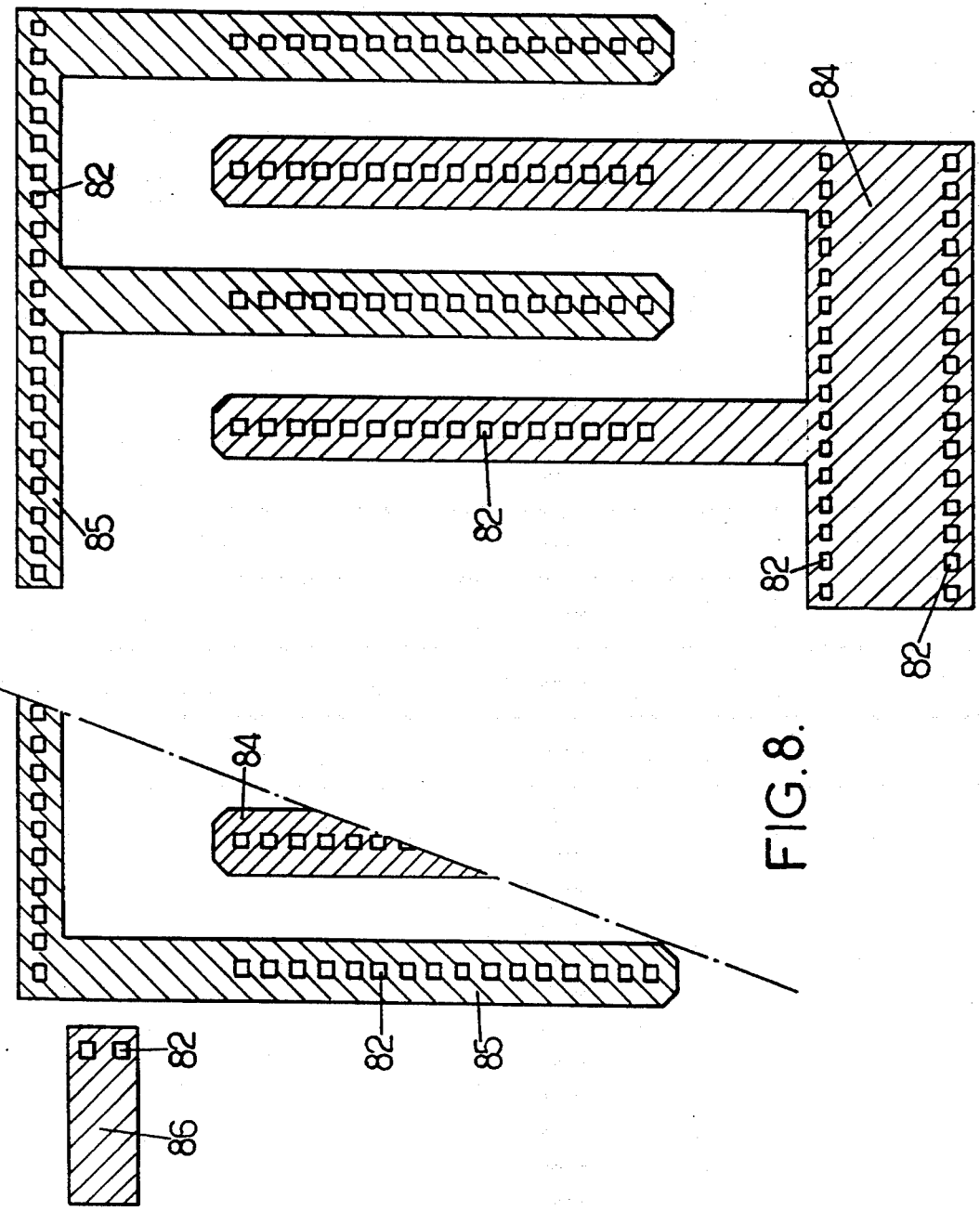

FIG. 8 is a top view similar to FIG. 7, showing the shapes of the portions 84-86 of the second metallization layer. FIGS. 7 and 8 can be superimposed to display the circuit. In both Figures, the little squares denote the locations of the vias 82 aligned above respective contact apertures 65-69 of the first metallization layer. It will be understood that the contact apertures 67-69 relating to thyristor 54 and diffusion 61 will generally be distributed all along their ring-shape configuration, only those having vias 82 thereabove being shown in FIG. 7.

When electrostatic charges appear on the output pad 40, a rise in voltage occurs between the substrate 20, at the potential Vss, and the drain 42 of the NMOS transistor 41. From a certain voltage threshold, electron-hole pairs are created by avalanche within the PN junction between the drain and the substrate. This results in a current of holes which diffuse into the substrate. Due to the resistivity of the substrate and to the fact that the connection 61 is further from the drain 42 than the region 60 forming the trigger electrode of the thyristor 54, the holes arrive in this region 60 before being removed by the connection 61 (arrow G in FIGS. 5 and 6). This local de-biasing of the substrate in the region 60 causes triggering of the thyristor 54 which becomes conducting with a very low resistivity so as to remove the energy of the discharge. The removal of the energy is particularly effective when the ring configuration is adopted. The polycrystalline silicon portion 71 further improves the ESD performance by preferentially drawing the hole current towards region 60 due to the electric field that it generates.

The device according to the invention is particularly suitable for CMOS-type integrated circuits, as this technology already presupposes the formation of N− wells in a P− substrate in order to produce the complementary MOS transistors. Accordingly, the production of the thyristor 16 or 54 does not need an additional process step for producing the well 21 or 56. Needless to say, if the circuit includes several I/O pads, a protection device will be provided for any or each input and/or output pad.

We claim:

1. An electrostatic discharge protection device for an integrated circuit, the integrated circuit including a substrate made of semiconductor and doped with impurities of a first type, said protection device comprising:
   at least one MOS transistor having a source consisting of a diffusion of a second type of impurities formed in the substrate and connected to a reference terminal of the integrated circuit, and a drain consisting of a diffusion of the second type of impurities formed in the substrate and connected to a pad of the integrated circuit; and
   a thyristor having a well formed in the substrate and doped with the second type of impurities, a first electrode consisting of a diffusion of the first type of impurities formed in the well and connected to said pad, a second electrode consisting of a diffusion of the second type of impurities formed in the substrate between the well and the drain of said MOS transistor and connected to said reference terminal, and a control electrode consisting of a region of the substrate situated between the well and the second electrode of the thyristor.

2. A device according to claim 1, wherein a diffusion of the second type of impurities is formed in the well of the thyristor and connected to the pad.

3. A device according to claim 1, wherein a diffusion of the first type of impurities is formed in the substrate and connected to the reference terminal, the well of the thyristor being situated between said diffusion of the first type of impurities and said MOS transistor.

4. A device according to claim 1, wherein the thyristor has a general ring configuration on the substrate about said MOS transistor.

5. A device according to claim 1, further comprising an insulating layer portion deposited on the substrate between the drain of the MOS transistor and the second electrode of the thyristor, and a conductive layer portion deposited on said insulating layer portion and connected to said reference terminal.

6. A device according to claim 5, wherein said conductive layer portion surrounds said MOS transistor, except in a region provided for connection of the transistor gate to the circuit node.

7. A device according to claim 6, wherein the thyristor has a general ring configuration on the substrate about said MOS transistor and said conductive layer portion.

8. A device according to claim 5, wherein said conductive layer portion is made of polycrystalline silicon.

9. A device according to claim 1, wherein each of said diffusions is covered by a respective thin oxide layer portion having contact apertures formed therein, wherein respective portions of a first metallization layer are deposited on said thin oxide layer portions and electrically connected to the respective underlying diffusions through said contact apertures, wherein said first metallization layer is covered by another oxide layer having vias formed therein in alignment above respective contact apertures of said thin oxide layer portion, and wherein respective portions of a second metallization layer are deposited on said other oxide layer and electrically connected to respective underlying portions of said first metallization layer through said vias for providing the connection of the drain of said MOS transistor and the first electrode of the thyristor to the pad and the connection of the source of said MOS transistor and the second electrode of the thyristor to said reference terminal.

10. A device according to claim 1, further comprising a metallization connected to the pad, said metallization being in contact with the first electrode of the thyristor and substantially covering the whole region situated between the first and second electrodes of the thyristor.

11. A device according to claim 1, wherein the drain of said MOS transistor is connected to the pad via a resistor.

12. A device according to claim 11, wherein said resistor consists of a region of the well of the thyristor.

13. An electrostatic discharge protection device for an integrated circuit, the integrated circuit including a substrate made of semiconductor doped with impurities of a first type, on which at least one MOS transistor is formed, having a gate control input linked to an input pad, said protection device comprising:

a turned-off MOS transistor having a gate linked to a reference terminal of the integrated circuit, a first electrode consisting of a diffusion of a second type of impurities formed in the substrate and connected to said gate control input, and a second electrode consisting of a diffusion of the second type of impurities formed in the substrate and connected to the reference terminal; and a thyristor having a well formed in the substrate and doped with the second type of impurities, a first electrode consisting of a diffusion of the first type of impurities formed in the well and connected to the input pad, a second electrode consisting of a diffusion of the second type of impurities formed in the substrate between the well and the first electrode of the turned-off MOS transistor and connected to the reference terminal, and a control electrode consisting of a region of the substrate situated between the well and the second electrode of the thyristor.

14. A device according to claim 13, wherein a diffusion of the second type of impurities is formed in the well of the thyristor and connected to the input pad.

15. A device according to claim 13, wherein a diffusion of the first type of impurities is formed in the substrate and linked to the reference terminal, the well of the thyristor being situated between said diffusion of the first type of impurities and the turned-off MOS transistor.

16. A device according to claim 13, further comprising a metallization connected to the input pad, said metallization being in contact with the first electrode of the thyristor and substantially covering the whole region situated between the first and second electrodes of the thyristor.

17. A device according to claim 13, further comprising a resistor connected between the input pad and the gate control input.

18. A device according to claim 17, wherein said resistor consists of a region of the well of the thyristor.

19. A device according to claim 13, wherein the turned-off MOS transistor and the thyristor have a general ring configuration on the substrate.

20. A device according to claim 19, wherein the turned-off MOS transistor occupies the central part of the ring configuration.

21. An output buffer for an integrated circuit, the integrated circuit including a substrate made of semiconductor and doped with impurities of a first type, said output buffer comprising:

at least one MOS transistor having a gate connected to a node of the integrated circuit, a source consisting of a diffusion of a second type of impurities formed in the substrate and connected to a reference terminal of the integrated circuit, and a drain consisting of a diffusion of the second type of impurities formed in the substrate and connected to an output pad of the integrated circuit; and a thyristor having a well formed in the substrate and doped with the second type of impurities, a first electrode consisting of a diffusion of the first type of impurities formed in the well and connected to said output pad, a second electrode consisting of a diffusion of the second type of impurities formed in the substrate between the well and the drain of said MOS transistor and connected to said reference terminal, and a control electrode consisting of a region of the substrate situated between the well and the second electrode of the thyristor.

22. An output buffer according to claim 21, wherein a diffusion of the second type of impurities is formed in the well of the thyristor and connected to the output pad.

23. An output buffer according to claim 21, wherein a diffusion of the first type of impurities is formed in the substrate and connected to the reference terminal, the well of the thyristor being situated between said diffusion of the first type of impurities and said MOS transistor.

24. An output buffer according to claim 21, wherein the thyristor has a general ring configuration on the substrate about said MOS transistor.

25. An output buffer according to claim 21, further comprising an insulating layer portion deposited on the substrate between the drain of the MOS transistor and the second electrode of the thyristor, and a conductive layer portion deposited on said insulating layer portion and connected to said reference terminal.

26. An output buffer according to claim 25, wherein said conductive layer portion surrounds said MOS transistor, except in a region provided for connection of the transistor gate to the circuit node.

27. An output buffer according to claim 26, wherein the thyristor has a general ring configuration on the substrate about said MOS transistor and said conductive layer portion.

28. A device according to claim 25, wherein said conductive layer portion is made of polycrystalline silicon.

29. An output buffer according to claim 21, wherein each of said diffusions is covered by a respective thin oxide layer portion having contact apertures formed therein, wherein respective portions of a first metallization layer are deposited on said thin oxide layer portions and electrically connected to the respective underlying diffusions through said contact apertures, wherein said first metallization layer is covered by another oxide layer having vias formed therein in alignment above respective contact apertures of said thin oxide layer portion, and wherein respective portions of a second metallization layer are deposited on said other oxide layer and electrically connected to respective underlying portions of said first metallization layer through said vias for providing the connection of the drain of said MOS transistor and the first electrode of the thyristor to the output pad and the connection of the source of said MOS transistor and the second electrode of the thyristor to said reference terminal.

* * * * *